United States Patent
Koga et al.

(10) Patent No.: US 10,294,163 B2
(45) Date of Patent: May 21, 2019

(54) SIC-COATED CARBON COMPOSITE MATERIAL

(71) Applicant: IBIDEN CO., LTD., Ogaki-shi, Gifu (JP)

(72) Inventors: Yasutaka Koga, Gifu (JP); Masatoshi Okuda, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 15/546,884

(22) PCT Filed: Jan. 22, 2016

(86) PCT No.: PCT/JP2016/051835
§ 371 (c)(1),
(2) Date: Jul. 27, 2017

(87) PCT Pub. No.: WO2016/121642
PCT Pub. Date: Aug. 4, 2016

(65) Prior Publication Data
US 2018/0002236 A1  Jan. 4, 2018

(30) Foreign Application Priority Data

Jan. 29, 2015  (JP) ................. 2015-015505

(51) Int. Cl.
*B32B 27/02* (2006.01)
*C04B 35/52* (2006.01)
*C04B 41/87* (2006.01)
*C01B 32/21* (2017.01)
*C04B 41/00* (2006.01)
*C04B 41/50* (2006.01)
*C23C 16/32* (2006.01)
*C23C 16/04* (2006.01)
*C04B 111/00* (2006.01)

(52) U.S. Cl.
CPC ............ *C04B 35/522* (2013.01); *C01B 32/21* (2017.08); *C04B 35/52* (2013.01); *C04B 41/009* (2013.01); *C04B 41/5059* (2013.01); *C04B 41/87* (2013.01); *C23C 16/045* (2013.01); *C23C 16/325* (2013.01); *C04B 2111/00405* (2013.01); *C04B 2235/3826* (2013.01); *C04B 2235/425* (2013.01); *C04B 2235/614* (2013.01); *C04B 2235/77* (2013.01)

(58) Field of Classification Search
CPC . C04B 35/522; C04B 41/009; C04B 41/5059; C04B 38/00; C04B 41/4531; C04B 2111/00405; C04B 2235/3826; C04B 2235/425; C04B 2235/614; C04B 2235/77; C04B 35/52; C04B 41/87; C01B 32/21; C23C 16/045; C23C 16/325
See application file for complete search history.

(56) References Cited

U.S. PATENT DOCUMENTS

2012/0040139 A1* 2/2012 Garandet ............. C04B 41/009
428/161

FOREIGN PATENT DOCUMENTS

| JP | H04-193705 A | 7/1992 |
|---|---|---|
| JP | H05-310487 A | 11/1993 |
| JP | H06-263568 A | 9/1994 |
| JP | H10-236893 A | 9/1998 |
| JP | 2000-302577 A | 10/2000 |
| JP | 2002-003285 A | 1/2002 |
| JP | 2007-173696 A | 7/2007 |

OTHER PUBLICATIONS

PCT/ISA/210 from PCT/2016/051835 with the English translation thereof.

* cited by examiner

*Primary Examiner* — Lawrence D Ferguson
(74) *Attorney, Agent, or Firm* — Carrier Blackman & Associates, P.C.; Joseph P. Carrier; Jeffrey T. Gedeon

(57) ABSTRACT

Provided is a SiC-coated carbon composite material including a graphite base material and a CVD-SiC coating covering the graphite base material. A porosity of a core part of the graphite base material is 12 to 20%, and a SiC-infiltrated layer extending from the CVD-SiC coating is included in a periphery of the core part of the graphite base material. The SiC-infiltrated layer is constituted of a plurality of regions arranged such that Si content becomes smaller stepwise in an order from a first surface on the CVD-SiC coating side toward a second surface on the graphite base material side.

5 Claims, 6 Drawing Sheets

SIC-COATED CARBON COMPOSITE MATERIAL

TECHNICAL FIELD

The present invention relates to a SiC-coated carbon composite material including a graphite base material and a SiC coating covering the graphite base material and a production method of same.

BACKGROUND ART

Structural materials which are used at high temperatures, such as members for semiconductor manufacturing apparatuses, members for heating furnaces, etc., are required to have heat resistance, chemical stability, strength, and so on. As those materials, graphite is widely used. Nonetheless the graphite is excellent in heat resistance, chemical stability, and strength, it is not an universal material in view of the facts that it is weak in a reaction with oxygen so that it is liable to be oxidized and consumed, it is soft so that it is liable to be worn, and it has reactivity with hydrogen, ammonia, or the like at high temperatures, and so on.

In order to compensate for those weaknesses of the graphite, a ceramic composite material in which a ceramic coating, such as SiC, etc., is formed on a surface of the graphite is widely used. In such a ceramic composite material, since the graphite and the ceramic coating are a heterogeneous material from each other, it is required to firmly bond the ceramic coating and the graphite base material to each other, thereby securing resistance to thermal shock.

In order to solve the foregoing problem, Patent Document 1 describes a SiC-coated graphite member that is a graphite member in which a SiC coating is cladded on a surface of a graphite base material by the CVD method, wherein the graphite base material has pore properties of an average pore diameter of 0.4 to 3 μm and a maximum pore diameter of 10 to 100 μm, an occupancy rate of SiC in a surface layer part of the graphite base material at a depth of 150 μm from the surface of the graphite base material is 15 to 50%, and an average crystal particle diameter of the SiC coating is 1 to 3 μm.

PRIOR ART REFERENCE

Patent Document

Patent Document 1: JP-A-2002-3285

SUMMARY OF INVENTION

Technical Problem

However, in the SiC-coated graphite member of Patent Document 1, since the occupancy rate of SiC in the surface layer part of the graphite base material at a depth of 150 μm from the surface of the graphite base material is 15 to 50%, it is estimated that an anchoring effect is thoroughly obtained. However, in view of the matter that the occupancy rate of the graphite that is the graphite base material is 85 to 50% or less in its residue, a warpage is liable to be generated due to a difference in thermal expansion. For this reason, there is a concern that as the thickness of the ceramic composite material having a ceramic coating on its surface is thinner, the dimensional accuracy becomes worse.

In addition, assuming that the occupancy rate of SiC at a depth of 150 μm from the surface of the graphite base material is 15 to 50%, the SiC cannot be deposited by the CVD method unless a porosity of the graphite at this depth is 15 to 50%. In order to allow a raw material gas of SiC to reach this depth, the SiC-coated graphite member of Patent Document 1 cannot be realized unless the graphite base material per se has a higher porosity.

In such graphite having a high porosity, a ratio of the solid portion is substantially low, and accordingly, the strength of the graphite base material itself becomes low. For this reason, the SiC-coated graphite member of Patent Document 1 is one in which the ceramic coating and the graphite base material are firmly bonded to each other while sacrificing the strength of the graphite base material, thereby obtaining excellent resistance to thermal shock.

In addition, since a CVD-SiC membrane infiltrates deeply into the surface of the graphite base material having a high porosity, there is a concern that deformation to be caused due to a difference in thermal expansion also becomes large.

An object of the present invention is to provide a SiC-coated carbon composite material using a graphite base material having a strength to withstand practical use, in which the coating is hardly exfoliated, and thermal deformation is hardly generated, and a production method of same.

Means for Solving the Problems

A SiC-coated carbon composite material of the present invention is a SiC-coated carbon composite material including: a graphite base material; and a CVD-SiC coating covering the graphite base material, wherein a porosity of a core part of the graphite base material is 12 to 20%, wherein a SiC-infiltrated layer extending from the CVD-SiC coating is included in a periphery of the core part, and wherein the SiC-infiltrated layer is constituted of a plurality of regions arranged such that Si content becomes smaller stepwise in an order from a first surface on the CVD-SiC coating side toward a second surface on the graphite base material side.

According to the SiC-coated carbon composite material of the present invention, the graphite base material in which a porosity of the core part is 12 to 20% is used. When the porosity of the core part is 12% or more, on the occasion of CVD, a raw material gas readily infiltrates into the inside of the pore, and the SiC-infiltrated layer in which SiC has infiltrated into the inside of the pore can be easily formed. In addition, when the porosity of the core part is 20% or less, a strength sufficient as graphite for structure can be provided.

In addition, the SiC-coated carbon composite material of the present invention includes the SiC-infiltrated layer extending from the CVD-SiC coating in the periphery of the core part of the graphite base material, and the SiC-infiltrated layer is constituted of a plurality of regions arranged such that the Si content becomes smaller stepwise in the order from the first surface on the CVD-SiC coating side toward the second surface on the graphite base material side. For this reason, a difference in thermal expansion as generated between the core part of the graphite base material and the CVD-SiC coating can be relieved by the plurality of regions where the Si content becomes smaller stepwise.

Furthermore, since the SiC-infiltrated layer of the SiC-coated carbon composite material of the present invention is constituted such that the Si content becomes smaller stepwise, by properly regulating a width of this region, the SiC-infiltrated layer of the SiC-coated carbon composite material can be formed in stages such that an influence of the difference in thermal expansion can be made smaller.

The Si content of the SiC-infiltrated layer refers to Si derived from SiC, and a relative amount thereof can be confirmed by measuring the intensity by means of EDX (energy dispersive X-ray spectrometry). That is, in order to confirm the ratio of SiC regarding SiC having infiltrated into the graphite base material, by confirming the intensity of Si included in only SiC, the relative content can be compared.

The SiC-coated carbon composite material of the present invention takes preferably the following embodiment.

(1) The SiC-infiltrated layer is constituted of a first region to an i-th region to an n-th region arranged in this order from the first surface toward the second surface, and Si content of the i-th region is larger than Si content of an (i+1)-th region.

That is, the SiC-infiltrated layer of the SiC-coated carbon composite material of the present invention is constituted such that the Si content in the region on the first surface side of the CVD-SiC coating side becomes higher. For this reason, the SiC-infiltrated layer efficiently relieves gradually a stress due to the difference in thermal expansion as generated between the core material of the graphite base material and the CVD-SiC coating. For this reason, a warpage and exfoliation to be caused due to the difference in thermal expansion can be more suppressed.

(2) A SiC-coated carbon composite material including: a graphite base material in which a porosity of a core part thereof is 12 to 20%; and a CVD-SiC coating covering the graphite base material, wherein a SiC-infiltrated layer extending from the CVD-SiC coating is included in a periphery of the core part, and wherein the SiC-infiltrated layer is constituted of a first region arranged on the CVD-SiC coating side and a second region arranged on the graphite base material side and having a smaller Si content than that of the first region.

According to the SiC-coated carbon composite material of the present invention, the graphite base material in which a porosity of the core part is 12 to 20% is used. When the porosity of the core part is 12% or more, on the occasion of CVD, a raw material gas readily infiltrates into the inside of the pore, and the SiC-infiltrated layer in which SiC has infiltrated into the inside of the pore can be easily formed. In addition, when the porosity of the core part is 20% or less, a strength sufficient as graphite for structure can be provided.

In addition, the SiC-coated carbon composite material of the present invention includes the SiC-infiltrated layer extending from the above-described CVD-SiC coating in the periphery of the core part of the graphite base material, and the above-described SiC-infiltrated layer is constituted of the first region arranged on the CVD-SiC coating side and the second region arranged on the graphite base material side and having a smaller Si content than that of the first region. For this reason, a difference in thermal expansion as generated between the core part of the graphite base material and the CVD-SiC coating can be relieved in stages by the first region and the second region having a smaller Si content than that of the first region in the order from the surface. For this reason, a warpage and exfoliation to be caused due to the difference in thermal expansion can be more suppressed.

Furthermore, since the SiC-infiltrated layer of the SiC-coated carbon composite material is constituted dividedly to the first region and the second region having a different Si content from each other, by properly regulating a width of the region, the SiC-infiltrated layer of the SiC-coated carbon composite material can be formed such that an influence of the difference in thermal expansion can be made small.

(3) The SiC-infiltrated layer has a thickness of 150 μm or more.

When the thickness of the SiC-infiltrated layer is 150 μm or more, a thermal stress generated between the core part of the graphite base material and the CVD-SiC coating can be made small, and the CVD-SiC coating can be made to be hardly exfoliated.

(4) The SiC-infiltrated layer has the thickness of 300 μm or more.

When the thickness of the SiC-infiltrated layer is 300 μm or more, the thermal stress generated between the core part of the graphite base material and the CVD-SiC coating can be made smaller, and the CVD-SiC coating can be made to be more hardly exfoliated. In addition, in the SiC-infiltrated layer of the present invention, since the regions having a different Si content from each other are formed in stages, the Si content of the region on the deeper side of the SiC-infiltrated layer can be regulated small, and the thermal stress to be caused due to the difference in thermal expansion of the SiC-infiltrated layer of the graphite base material from the deeper part can be made smaller.

(5) The porosity of the core part is 15 to 17%.

When the porosity of the core part of the graphite base material is 15% or more, on the occasion of CVD, the raw material gas readily infiltrates into the inside of the pore, and the SiC-infiltrated layer in which SiC has infiltrated into the inside of the pore can be more readily formed. In addition, when the porosity of the core part is 17% or less, the strength sufficient as graphite for structure can be provided.

(6) A true density of the core part is 2.15 to 2.23 g/cm³.

When the true density of the core part of the graphite base material is 2.15 g/cm³ or more, it is close to a theoretical density of 2.26 g/cm³ of a crystal of the graphite, and the resulting graphite is one in which crystallization is more advanced. When the graphite material is thermally treated at 2,000° C. or higher in a manufacturing process, the true density of 2.15 g/cm³ or more can be obtained. For this reason, even when the SiC-coated carbon composite material is placed at high temperatures, a SiC-coated carbon composite material with high dimensional accuracy, in which crystallization (graphitization) of the graphite base material is hardly advanced more than the above, and deformation is hardly caused, can be provided. In addition, when the true density of the core part of the graphite base material is 2.23 g/cm² or less, the crystallization of the graphite is not excessively advanced, and the graphite crystal has disturbance. For this reason, the expanse of crystal in the a-axis and b-axis directions is small, exfoliation in the c-axis direction bonded by the van der Waals force can be prevented from occurring, and the CVD-SiC coating can be made to be hardly exfoliated from the graphite base material.

In the production method of a SiC-coated carbon composite material of the present invention, the following embodiment is preferable.

(7) Forming the CVD-SiC coating and the SiC-infiltrated layer on a surface of the graphite base material by using the graphite base material having a porosity of 12 to 20%, dividing a CVD process to a plurality of stages, and performing the CVD process by changing a diffusion rate of a raw material gas so as to become slower every time when passing through the stage, or changing a decomposition rate of the raw material gas so as to become faster every time when passing through the stage.

By performing the CVD process by changing the diffusion rate of the raw material gas so as to become slower every time when passing through the stage, or changing the decomposition rate of the raw material gas so as to become faster every time when passing through the stage, not only the SiC-infiltrated layer can be formed deeply in the inside of the pore at the first stage, but also SiC can be efficiently formed in the vicinity of the inlet of the pore at the later stage.

Furthermore, in the production method of a SiC-coated carbon composite material of the present invention, the following embodiments are preferable.

(8) A reaction temperature is raised every time when passing through the stage.

By raising the reaction temperature every time when passing through the stage, the decomposition rate of the raw material gas can be made faster every time when passing through the stage. For this reason, not only the SiC-infiltrated layer can be formed deeply in the inside of the pore at the initial stage, but also SiC can be efficiently formed in the vicinity of the inlet of the pore at the later stage.

(9) A furnace pressure is raised every time when passing through the stage.

By raising the furnace pressure every time when passing through the stage, the diffusion rate of the raw material gas can be made slower every time when passing through the stage. For this reason, not only the SiC-infiltrated layer can be formed deeply in the inside of the pore at the initial stage, but also SiC can be efficiently formed in the vicinity of the inlet of the pore at the later stage.

(10) A concentration of the raw material gas is raised every time when passing through the stage.

The concentration of the raw material gas is raised every time when passing through the stage. A reaction rate of the raw material gas can be made faster every time when passing the stage. For this reason, not only the SiC-infiltrated layer can be formed deeply in the inside of the pore at the initial stage, but also SiC can be efficiently formed in the vicinity of the inlet of the pore at the later stage.

Advantageous Effects of Invention

According to the SiC-coated carbon composite material of the present invention, the graphite base material in which a porosity of the core part is 12 to 20% is used. When the porosity of the core part is 12% or more, on the occasion of CVD, a raw material gas readily infiltrates into the inside of the pore, and the SiC-infiltrated layer in which SiC has infiltrated into the inside of the pore can be easily formed. In addition, when the porosity of the core part is 20% or less, a strength sufficient as graphite for structure can be provided.

In addition, the SiC-coated carbon composite material of the present invention includes the SiC-infiltrated layer extending from the CVD-SiC coating in the periphery of the core part of the graphite base material, and the SiC-infiltrated layer is constituted of a plurality of regions where the Si content becomes smaller stepwise in the order from the surface (face on the CVD-SiC coating side). For this reason, a difference in thermal expansion as generated between the core part of the graphite base material and the CVD-SiC coating can be relieved by the plurality of regions where the Si content becomes smaller stepwise. Furthermore, since the SiC-infiltrated layer of the SiC-coated carbon composite material of the present invention is constituted such that the Si content becomes smaller stepwise, by properly regulating a width of this region, the SiC-infiltrated layer of the SiC-coated carbon composite material can be formed in stages such that an influence of the difference in thermal expansion can be made smaller.

In addition, according to the SiC-coated carbon composite material of the present invention, the graphite base material in which a porosity of the core part is 12 to 20% is used. When the porosity of the core part is 12% or more, on the occasion of CVD, a raw material gas readily infiltrates into the inside of the pore, and the SiC-infiltrated layer in which SiC has infiltrated into the inside of the pore can be easily formed. In addition, when the porosity of the core part is 20% or less, a strength sufficient as graphite for structure can be provided.

In addition, the SiC-coated carbon composite material of the present invention includes the SiC-infiltrated layer extending from the CVD-SiC coating in the periphery of the core part of the graphite base material, and the SiC-infiltrated layer is constituted of a first region and a second region having a smaller Si content than that of the first region in the order from the surface (surface on the CVD-SiC coating side). For this reason, a difference in thermal expansion as generated between the core part of the graphite base material and the CVD-SiC coating can be relieved in stages by the first region and the second region having a smaller Si content than that of the first region in the order from the surface. For this reason, a warpage and exfoliation to be caused due to the difference in thermal expansion can be more suppressed.

Furthermore, since the SiC-infiltrated layer of the SiC-coated carbon composite material of the present invention is constituted dividedly to the first region and the second region having a different Si content from each other, by properly regulating a width of the region, the SiC-infiltrated layer of the SiC-coated carbon composite material can be formed such that an influence of the difference in thermal expansion can be made smaller.

DESCRIPTION OF EMBODIMENTS

Figure 1:
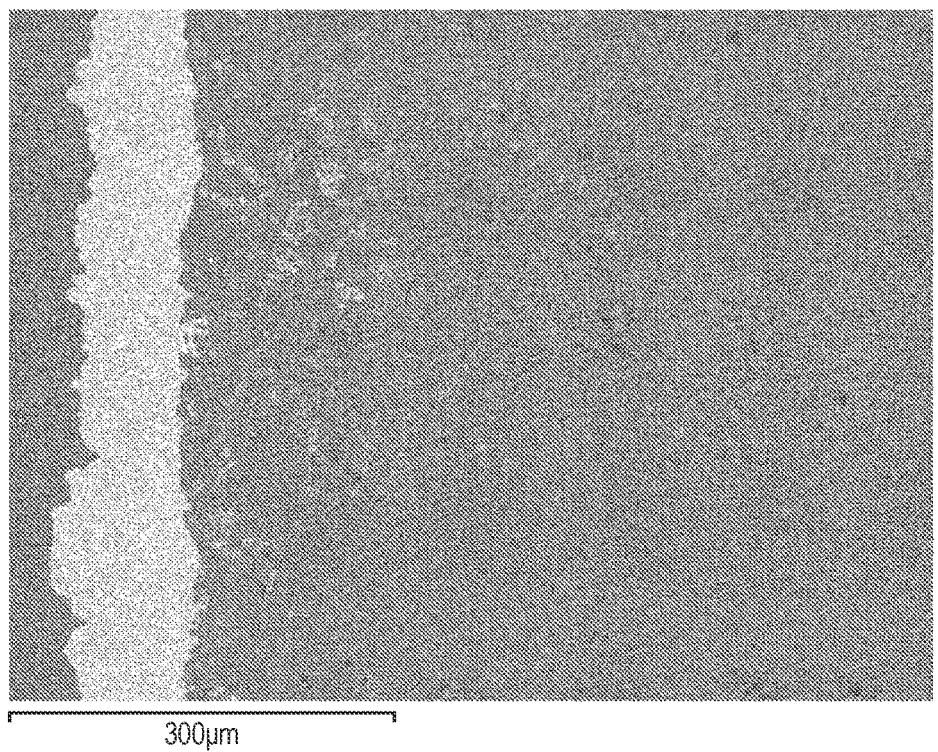
FIG. 1 is a scanning electron microscopic photograph of a cross section resulting from cutting of a sample of a SiC-coated carbon composite material of Example.

A SiC-coated carbon composite material of the present invention is a SiC-coated carbon composite material including a graphite base material and a CVD-SiC coating covering the graphite base material. A porosity of a core part of the graphite base material is 12 to 20%, and a SiC-infiltrated layer extending from the CVD-SiC coating is included in a periphery of the core part of the graphite base material. The SiC-infiltrated layer is constituted of a plurality of regions where Si content becomes smaller stepwise in an order from the surface.

The core part of the graphite base material refers to a portion of the graphite base material other than the SiC-infiltrated layer.

It is meant by the terms "the Si content becomes smaller stepwise in an order from the surface" that the plurality of regions are formed within the SiC-infiltrated layer, and the Si content of each region becomes smaller gradually from a first surface on the CVD-SiC coating side toward a second surface on the graphite base material side in order.

In the SiC-coated carbon composite material of the present invention, the graphite base material in which a porosity of the core part is 12 to 20% is used. When the porosity of the core part is 12% or more, on the occasion of CVD, the raw material gas readily infiltrates into the inside of the pore, so that the SiC-infiltrated layer in which SiC has infiltrated into the inside of the pore can be easily formed. In addition, when the porosity of the core part is 20% or less, a strength sufficient as graphite for structure can be provided.

In addition, the SiC-coated carbon composite material of the present invention includes the SiC-infiltrated layer extending from the CVD-SiC coating in the periphery of the core part of the graphite base material, and the SiC-infiltrated layer is constituted of a plurality of regions where the Si content becomes smaller stepwise in the order from the surface (face on the CVD-SiC coating side). For this reason, a difference in thermal expansion as generated between the core part of the graphite base material and the CVD-SiC coating can be relieved by the plurality of regions.

Furthermore, since the SiC-infiltrated layer of the SiC-coated carbon composite material of the present invention is constituted such that the Si content becomes smaller stepwise, by properly regulating a width of this region (a width in the thickness direction of the SiC-infiltrated layer), the SiC-infiltrated layer of the SiC-coated carbon composite material can be formed in stages such that an influence of the difference in thermal expansion can be made smaller.

The Si content of the SiC-infiltrated layer refers to Si derived from SiC, and a relative amount thereof can be confirmed by measuring the intensity by means of EDX (energy dispersive X-ray spectrometry). That is, in order to confirm the ratio of SiC regarding SiC having infiltrated into the graphite base material, when the intensity of Si included in only SiC is confirmed, the relative content can be compared.

In the present invention, the intensity of Si is calculated in the following manner.
(a) Polishing The SiC-coated carbon composite material is cut, and a cross section thereof is polished by the ion polishing method.

Apparatus: JEOL, SM-090110
Accelerating voltage: 6 kV
Time: 13 hours
(b) EDX (Energy Dispersive X-Ray Spectrometry)
Apparatus: OXFORD INSTRUMENTS, Energy 250
Accelerating voltage: 15.0 kV
Line analysis: Intervals of 60 µm are provided, and the measurement of 9 traces/sample is carried out.

Analysis: An interval of 2.8 µm is provided every one trace, the intensity of Si is read, the Si intensities of the same site are summed up, and then a moving average of data at 12 points is calculated. According to this, a graph resulting from analysis of a detection intensity of Si in a depth direction is obtained.

The SiC-infiltrated layer is constituted of a first region to an i-th region to an n-th region arranged in this order from the surface (face on the CVD-SiC coating side), and it is preferable that the Si content of the i-th region is always larger than the Si content of the (i+1)-th region. Here, i and n are each a positive integer larger than 1, and there is a relation of ($1<i<n$).

That is, the SiC-infiltrated layer of the SiC-coated carbon composite material is constituted such that the Si content of the region on the surface side (region on the CVD-SiC coating side) is always higher than that of the region on the reverse side (region on the graphite base material side). For this reason, the SiC-infiltrated layer efficiently relieves gradually a stress due to the difference in thermal expansion as generated between the core material of the graphite base material and the CVD-SiC coating. For this reason, a warpage and exfoliation to be caused due to the difference in thermal expansion can be more suppressed.

In addition, the SiC-coated carbon composite material of the present invention is a SiC-coated carbon composite material including a graphite base material in which a porosity of the core part is 12 to 20% and a CVD-SiC coating covering the graphite base material. A SiC-infiltrated layer extending from the CVD-SiC coating is included in the periphery of the core part of the graphite base material. The SiC-infiltrated layer is constituted of a first region arranged on the CVD-SiC coating side and a second region arranged on the graphite base material side and having a smaller Si content than that of the first region.

In the SiC-coated carbon composite material of the present invention, the graphite base material in which a porosity of the core part is 12 to 20% is used. When the porosity of the core part is 12% or more, on the occasion of CVD, the raw material gas readily infiltrates into the inside of the pore, so that the SiC-infiltrated layer in which SiC has infiltrated into the inside of the pore can be easily formed. In addition, when the porosity of the core part is 20% or less, a strength sufficient as graphite for structure can be provided.

In addition, the SiC-coated carbon composite material of the present invention includes the SiC-infiltrated layer extending from the CVD-SiC coating in the periphery of the core part of the graphite base material, and the SiC-infiltrated layer is constituted of a first region and a second region having a smaller Si content than that of the first region as arranged in the order from the surface (face on the CVD-SiC coating side). For this reason, a difference in thermal expansion as generated between the core part of the graphite base material and the CVD-SiC coating can be relieved in stages by the first region and the second region having a smaller Si content than that of the first region in the order from the surface. For this reason, a warpage and exfoliation to be caused due to the difference in thermal expansion can be more suppressed.

Furthermore, since the SiC-infiltrated layer of the SiC-coated carbon composite material of the present invention is constituted dividedly to the first region and the second region having a different Si content from each other, by properly regulating a width of the region (a width in the thickness direction of the SiC-infiltrated layer), the SiC-infiltrated layer of the SiC-coated carbon composite material can be formed such that an influence of the difference in thermal expansion can be made smaller.

In the SiC-coated carbon composite material, it is preferable that a thickness of the SiC-infiltrated layer is 150 µm or more.

When the thickness of the SiC-infiltrated layer is 150 µm or more, a thermal stress generated between the core part of the graphite base material and the CVD-SiC coating can be made small, and the CVD-SiC coating can be made to be hardly exfoliated.

In the SiC-coated carbon composite material, it is preferable that the thickness of the SiC-infiltrated layer is 300 μm or more.

When the thickness of the SiC-infiltrated layer is 300 μm or more, the thermal stress generated between the core part of the graphite base material and the CVD-SiC coating can be made smaller, and the CVD-SiC coating can be made to be more hardly exfoliated. In addition, in the SiC-infiltrated layer of the present invention, the plural regions having a different Si content from each other are formed in line in an adjacent state to each other. Accordingly, the Si content of the region arranged on the deeper side (graphite base material side) of the SiC-infiltrated layer can be regulated small, and the thermal stress to be caused due to the difference in thermal expansion of the SiC-infiltrated layer of the graphite base material from the deeper part can be made smaller.

In addition, in the SiC-coated carbon composite material, it is preferable that the thickness of the SiC-infiltrated layer is 1,000 μm or less. When the thickness of the SiC-infiltrated layer is 1,000 μm or less, even when the SiC-infiltrated layer is formed, and SiC infiltrates into the graphite base material, the core part having a sufficient thickness can be allowed to remain, and a warpage and deformation can be made to be hardly caused.

In the SiC-coated carbon composite material, it is preferable that a porosity of the core part of the graphite base material is 15 to 17%.

When the porosity of the core part of the graphite base material is 15% or more, on the occasion of CVD, the raw material gas readily infiltrates into the inside of the pore, and the SiC-infiltrated layer in which SiC has infiltrated into the inside of the pore can be more readily formed. In addition, when the porosity of the core part is 17% or less, the strength sufficient as graphite for structure can be provided.

In the SiC-coated carbon composite material, it is preferable that a true density of the core part of the graphite base material is 2.15 to 2.23 g/cm$^3$.

In the SiC-coated carbon composite material of the present invention, when the true density of the core part of the graphite base material is 2.15 g/cm$^3$ or more, it is close to a theoretical density of 2.26 g/cm$^3$ of a crystal of the graphite, and the resulting graphite is one in which crystallization is more advanced. When the graphite material is thermally treated at 2,000° C. or higher in a manufacturing process, the true density of 2.15 g/cm$^3$ or more can be obtained. For this reason, even when the SiC-coated carbon composite material is placed at high temperatures, a SiC-coated carbon composite material with high dimensional accuracy, in which crystallization (graphitization) of the graphite base material is hardly advanced more than the above, and deformation is hardly caused, can be provided. In addition, when the true density of the core part of the graphite base material is 2.23 g/cm$^2$ or less, the crystallization of the graphite is not excessively advanced, and the graphite crystal has disturbance. For this reason, the expanse of crystal in the a-axis and b-axis directions is small, exfoliation in the c-axis direction bonded by the van der Waals force can be prevented from occurring, and the CVD-SiC coating can be made to be hardly exfoliated from the graphite base material.

In the present invention, the porosity can be obtained by calculating the product of an amount of pores per unit weight [cm$^3$/g] of the graphite base material and a bulk density [g/cm$^3$]. For this reason, the porosity is a porosity on a volume basis expressed in terms of a unit of [Vol/Vol].

The bulk density is obtained by simply dividing a mass of the sample by a volume of the sample.

The amount of pores per unit weight can be measured with a mercury porosimeter.

Specific measurement apparatus and method are as follows.

Sample preparation: A sample of ϕ8×10 mm is ultrasonically cleaned with methanol for 5 minutes and then dried. According to this operation, a powder attached to the surface is removed.

The amount of pores can be measured under the following condition.

Apparatus: Pascal 240, manufactured by Thermo Electron SpA

Pressure range: Atmospheric pressure to 200 MPa

Set value of mercury contact angle: 141.3°

In the present invention, the true density can be measured in conformity with the butanol method described in JIS R7212-1995 (testing methods for carbon blocks).

The production method of a SiC-coated carbon composite material of the present invention is explained.

In the production method of a SiC-coated carbon composite material of the present invention, the CVD-SiC coating and the SiC-infiltrated layer are formed on the surface of the graphite base material by using a graphite base material having a porosity of 12 to 20%, dividing a CVD process to a plurality of stages, and performing the CVD process by changing a diffusion rate of a raw material gas so as to become slower every time when passing through the stage, or changing a decomposition rate of the raw material gas so as to become faster every time when passing through the stage.

By performing the CVD process by changing the diffusion rate of the raw material gas so as to become slower every time when passing through the stage, or changing the decomposition rate of the raw material gas so as to become faster every time when passing through the stage, not only the SiC-infiltrated layer can be formed deeply in the inside of the pore at the initial stage, but also SiC can be efficiently formed in the vicinity of the inlet of the pore at the later stage.

Furthermore, in the production method of a SiC-coated carbon composite material of the present invention, the following embodiments are preferable.

A reaction temperature is raised every time when passing through the stage.

By raising the reaction temperature every time when passing through the stage, the decomposition rate of the raw material gas can be made faster every time when passing through the stage. For this reason, not only the SiC-infiltrated layer can be formed deeply in the inside of the pore at the initial stage, but also SiC can be efficiently formed in the vicinity of the inlet of the pore at the later stage.

A furnace pressure is raised every time when passing through the stage.

By raising the furnace pressure every time when passing through the stage, the diffusion rate of the raw material gas can be made slower every time when passing through the stage. For this reason, not only the SiC-infiltrated layer can be formed deeply in the inside of the pore at the initial stage, but also SiC can be efficiently formed in the vicinity of the inlet of the pore at the later stage.

A concentration of the raw material gas is raised every time when passing through the stage.

The concentration of the raw material gas is raised every time when passing through the stage. A reaction rate of the raw material gas can be made faster every time when passing the stage. For this reason, not only the SiC-infiltrated layer can be formed deeply in the inside of the pore at the initial stage, but also SiC can be efficiently formed in the vicinity of the inlet of the pore at the later stage.

The SiC-coated carbon composite material of the present invention can be obtained by a CVD process of forming a CVD-SiC coating on a graphite base material obtained by processing the graphite material in an objective shape.

In the case of forming a CVD-SiC coating by the CVD method, a chemical reaction does not take place in the graphite material. For this reason, in the core part excluding the SiC-infiltrated layer into which the raw material gas of SiC infiltrates, the used graphite material remains as it is. In addition, a portion of the SiC-infiltrated layer other than SiC is constituted of the original graphite material. Namely, in the graphite base material, SiC infiltrates into a surface layer portion of the graphite material processed after passing through the CVD process, and the SiC-infiltrated layer is formed.

The graphite material is processed according to the objective shape to obtain the graphite base material. The CVD-SiC coating is coated in a thickness of, for example, about 10 to 200 μm. For this reason, by processing the graphite base material smaller than the objective size by the thickness of the CVD-SiC coating, the objective shape can be obtained.

The porosity of the graphite base material to be used is preferably 12 to 20%. In the graphite base material, the characteristics, such as the porosity of the core part, etc., do not vary even after passing through the CVD process. For this reason, the preferable range of the porosity does not vary before and after the CVD process. When the porosity of the graphite base material is 12% or more, on the occasion of CVD, a raw material gas readily infiltrates into the inside of the pore, and the SiC-infiltrated layer in which SiC has infiltrated into the inside of the pore can be easily formed. In addition, when the porosity of the graphite base material is 20% or less, a strength sufficient as graphite for structure can be provided.

The porosity of the graphite base material to be used is more preferably 15 to 17%. When the porosity of the graphite base material is 15% or more, on the occasion of CVD, the raw material gas readily infiltrates into the inside of the pore, and the SiC-infiltrated layer in which SiC has infiltrated into the inside of the pore can be more easily formed. In addition, when the porosity of the graphite base material is 17% or less, the strength sufficient as graphite for structure can be provided.

The true density of the graphite base material to be used is preferably 2.15 to 2.23 g/cm$^3$ in at least the core part. In the graphite base material, the characteristics, such as the true density of the graphite per se, etc., do not vary even after passing through the CVD process. When the true density of at least the core part of the graphite base material is 2.15 g/cm$^3$ or more, it is close to a theoretical density of 2.26 g/cm$^3$ of a crystal of graphite, and the resulting graphite is one in which crystallization is more advanced. When the graphite material is thermally treated at 2,000° C. or higher in a manufacturing process, the true density of 2.15 g/cm$^3$ or more can be obtained. For this reason, even when the SiC-coated carbon composite material is placed at high temperatures, a SiC-coated carbon composite material with high dimensional accuracy, in which crystallization (graphitization) of the graphite base material is hardly advanced more than the above, and deformation is hardly caused, can be provided. In addition, when the true density of at least the core part of the graphite base material is 2.23 g/cm$^2$ or less, the crystallization of the graphite is not excessively advanced, and the graphite crystal has disturbance. For this reason, the expanse of crystal in the a-axis and b-axis directions is small, exfoliation in the c-axis direction bonded by the van der Waals force can be prevented from occurring, and the CVD-SiC coating can be made to be hardly exfoliated from the graphite base material.

The SiC-coated carbon composite material of the present invention includes the SiC-infiltrated layer extending from the CVD-SiC coating, and the SiC-infiltrated layer is constituted of a plurality of regions where the Si content becomes smaller stepwise in the order from the surface (face on the CVD-SiC coating side). The SiC-infiltrated layer having such a constitution can be, for example, formed in the following manner.

The formation of the SiC-infiltrated layer of the SiC-coated carbon composite material of the present invention utilizes the following principle.

On the occasion of forming the CVD-SiC coating by the CVD method, since the raw material is a gas, SiC is also deposited in the inside of the pore of the graphite base material. What depth of the inside of the pore does the raw material gas reach is determined by a balance between a decomposition rate of the raw material gas and a diffusion rate of the raw material gas by CVD.

In the case where the decomposition rate of the raw material gas is faster relative to the diffusion rate of the raw material gas, the raw material gas does not deeply reach the pore, so that SiC is formed at a fast rate in the vicinity of the inlet of the pore.

Conversely, in the case where the diffusion rate of the raw material gas is faster relative to the decomposition rate of the raw material gas, SiC is hardly formed in the vicinity of the inlet of the pore. Thus, the raw material gas deeply reaches the pore, whereas a formation rate of SiC in the inside of the pore becomes slow. For this reason, in the case where the diffusion rate of the raw material gas is fast relative to the decomposition rate of the raw material gas, by forming a film while taking time, SiC can be thoroughly infiltrated into the inside of the pore.

That is, by performing the CVD process by dividing it to a plurality of stages such that the decomposition rate of the raw material gas becomes faster gradually relative to the diffusion rate of the raw material gas, the SiC-infiltrated layer constituted of a plurality of regions where the Si content becomes smaller stepwise in the order from the surface (face of the CVD-SiC coating side) can be formed.

A formation method of the actual SiC-infiltrated layer is explained.

The diffusion rate of the raw material gas relies upon a pressure within the furnace, a reaction temperature, and so on, and the decomposition rate of the raw material gas relies upon a reaction temperature, a concentration of the raw material gas, a partial pressure of the raw material gas, and so on.

In the CVD process, as for the decomposition temperature, an influence against the decomposition rate of the raw material gas is overwhelmingly higher than an influence against the diffusion rate of the raw material gas, and the decomposition temperature can be suitably used as a means for regulating the decomposition rate and the diffusion rate of the raw material gas. Specifically, when the reaction temperature becomes high, the decomposition rate is more likely influenced than the diffusion rate, the decomposition rate becomes rapidly fast, and SiC is readily formed in the vicinity of the inlet of the pore. Conversely, when the reaction temperature becomes low, though SiC is readily formed to the inside of the pore, a rate at which SiC is formed becomes slow.

In the CVD process, as for the concentration of the raw material gas, an influence against the decomposition rate of the raw material gas is higher than an influence against the diffusion rate of the raw material gas, and the concentration of the raw material gas can be suitably used as a means for regulating the decomposition rate and the diffusion rate of the raw material gas. Specifically, when the concentration of the raw material gas becomes high, since a probability of collision becomes high, the decomposition rate becomes fast, and SiC is readily formed in the vicinity of the inlet of the pore. Conversely, when the concentration of the raw material gas becomes low, since a probability of collision becomes small, the decomposition rate becomes slow, and SiC is readily formed to the inside of the pore.

In the CVD process, an influence of the pressure within the furnace against the diffusion rate of the raw material gas is higher than an influence of the pressure within the furnace against the decomposition rate of the raw material gas, and thus, the pressure within the furnace can be suitably used as a means for regulating the decomposition rate and the diffusion rate of the raw material gas. Specifically, when the pressure within the furnace becomes high, since a mean free path becomes small, the decomposition rate becomes faster than the diffusion rate, and SiC is readily formed in the vicinity of the inlet of the pore. Conversely, when the pressure within the furnace becomes low, since the mean free path becomes large, the diffusion rate becomes faster than the decomposition rate, and SiC is readily formed to the inside of the pore.

The SiC-coated carbon composite material of the present invention can be obtained by dividing the CVD process to a plurality of stages and also performing the CVD process by changing a diffusion rate of the raw material gas so as to become slower every time when passing through the stage, or changing a decomposition rate of the raw material gas so as to become faster every time when passing through the stage.

As for the matter that the decomposition rate of the raw material gas becomes faster than the diffusion rate of the raw material gas every time when passing through the stage, a production method of raising the reaction temperature every time when passing through the stage, a production method of raising the furnace pressure every time when passing through the stage, a production method of raising the concentration of the raw material gas every time when passing through the stage, and so on can be selected. In addition, the plurality of stages may also be constituted by combining a plurality of means.

The size of the decomposition rate of the raw material gas and the size of the diffusion rate of the raw material gas are not the identical dimension, and therefore, these are determined through relative comparison but not direct comparison.

The raw material gas in the CVD process of the production method of a SiC-coated carbon composite material of the present invention is not particularly restricted. For example, a combination of a carbon source and a silicon source can be used as the raw material gas. As the carbon source, for example, methane, ethane, propane, and the like can be used. As the silicon source, for example, a silane, a halogenated silane, and the like can be utilized. In addition, the carbon source and the silicon source can be simultaneously used as the raw material gas. For example, as the raw material gas in which the carbon source and the silicon source are used simultaneously, methylsilane, methylchlorosilane, methyldichlorosilane, methyltrichlorosilane (MTS), methylbromosilane, methyldibromosilane, methyltribromosilane, and the like can be utilized.

EXAMPLES

Next, Example and Comparative Examples 1 and 2 of the SiC-coated carbon composite material of the present invention are explained in order.

<Processing Step>

In Example and Comparative Examples 1 and 2, a graphite base material of 15×15×5 mm is prepared using EX-60, manufactured by Ibiden Co., Ltd. The processing step is common in all of the Example and Comparative Examples.

A porosity of the graphite base material is 16%, and a true density thereof is 2.20 g/cm$^3$.

In Comparative Example 3, a graphite base material of 15×15×5 mm is prepared using an artificial graphite electrode. A porosity of the graphite base material is 23%, and a true density thereof is 2.25 g/cm$^3$.

<CVD Process>

A CVD-SiC coating is formed on each of the graphite base materials obtained in the processing step. A production condition of the CVD process is as follows. In all of the Examples and Comparative Examples, for example, a combination of a carbon source and a silicon source can be used as the raw material gas. As the carbon source, for example, methane, ethane, propane, and the like can be used. As the silicon source, for example, a silane, a halogenated silane, and the like can be utilized. In addition, the carbon source and the silicon source can be simultaneously used as the raw material gas. For example, as the raw material gas in which the carbon source and the silicon source are used simultaneously, methylsilane, methylchlorosilane, methyldichlorosilane, methyltrichlorosilane (MTS), methylbromosilane, methyldibromosilane, methyltribromosilane, and the like can be utilized. In all of the Example and Comparative Examples, since a thorough thickness is provided, a core part of the graphite base material remains, and the core part has the same porosity and true density as in the original graphite base material.

Figure 3:
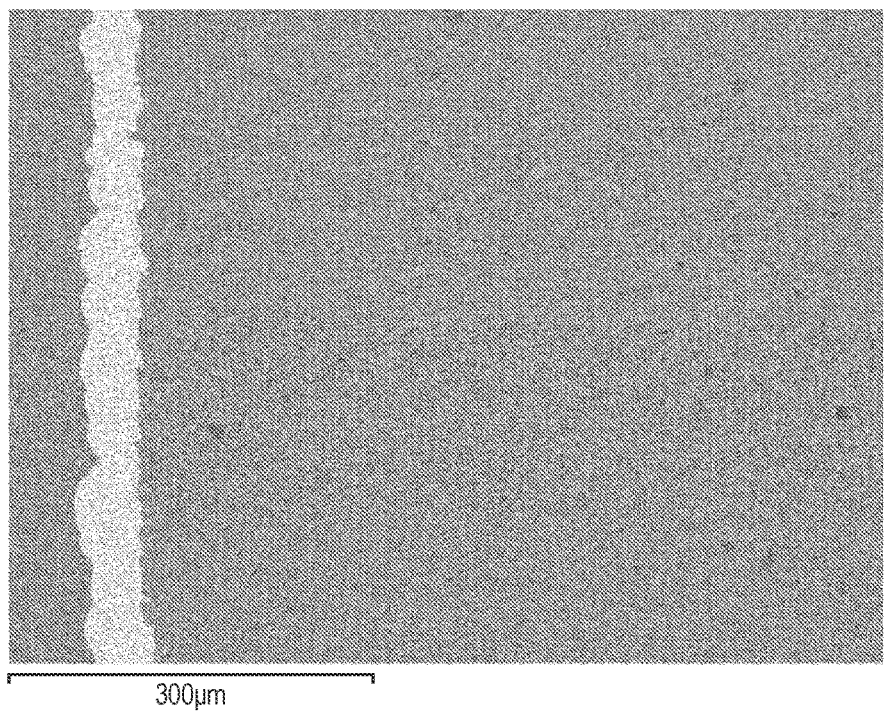
FIG. 3 is a scanning electron microscopic photograph of a cross section resulting from cutting of a sample of a SiC-coated carbon composite material of Comparative Example 1.
Figure 5:
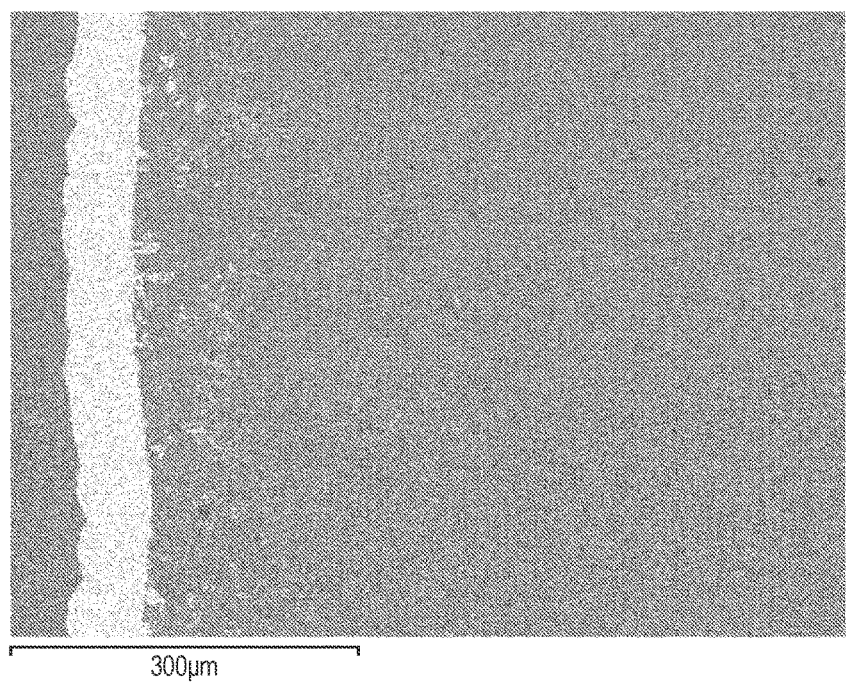
FIG. 5 is a scanning electron microscopic photograph of a cross section resulting from cutting of a sample of a SiC-coated carbon composite material of Comparative Example 5.

Each of samples of the Example and Comparative Examples obtained according to the above-described processing step and CVD process was cut and analyzed. Specifically, the cross section was observed with a scanning electron microscope (see FIGS. 1, 3, and 5).

In Comparative Example 3, after passing through the CVD process, reticulated cracks were generated, so that the sample was not practically useful.

Figure 2:
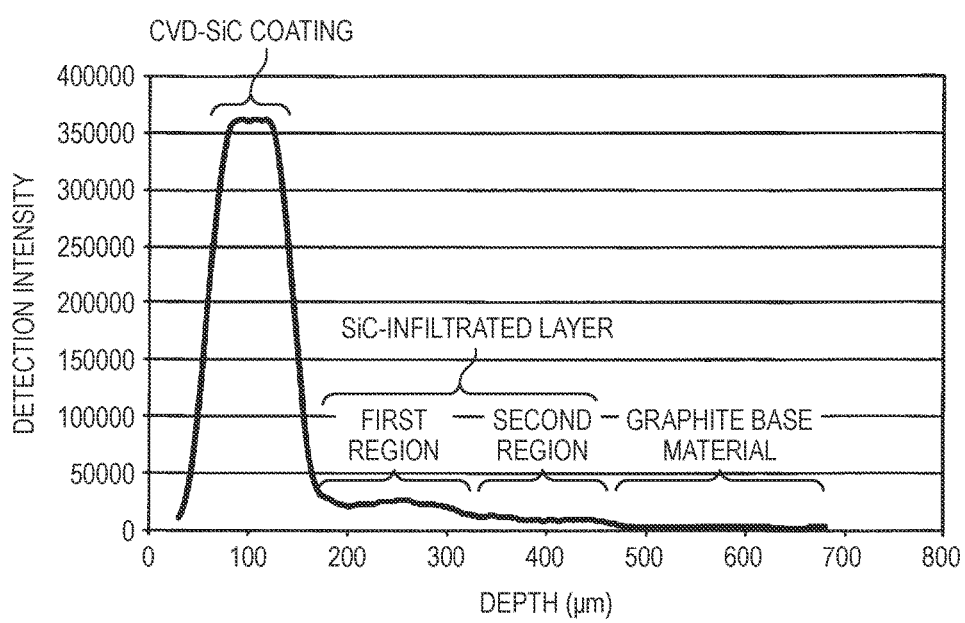
FIG. 2 is a graph obtained by analyzing a detection intensity of Si in a depth direction of the sample of FIG. 1 by means of EDX (energy dispersive X-ray spectrometry).
Figure 4:
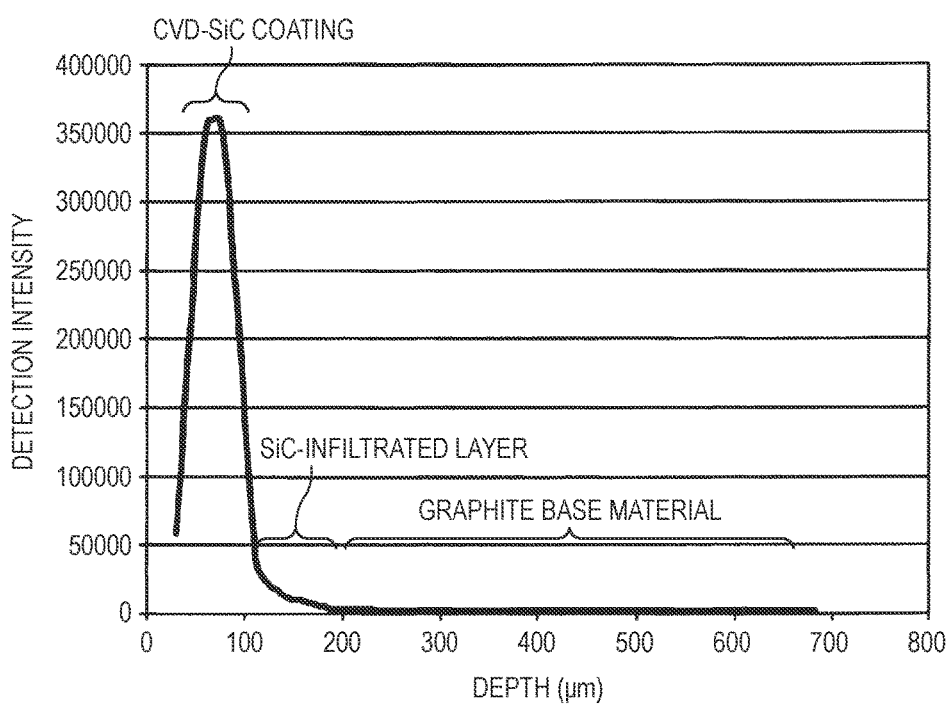
FIG. 4 is a graph obtained by analyzing a detection intensity of Si in a depth direction of the sample of FIG. 3 by means of EDX (energy dispersive X-ray spectrometry).
Figure 6:
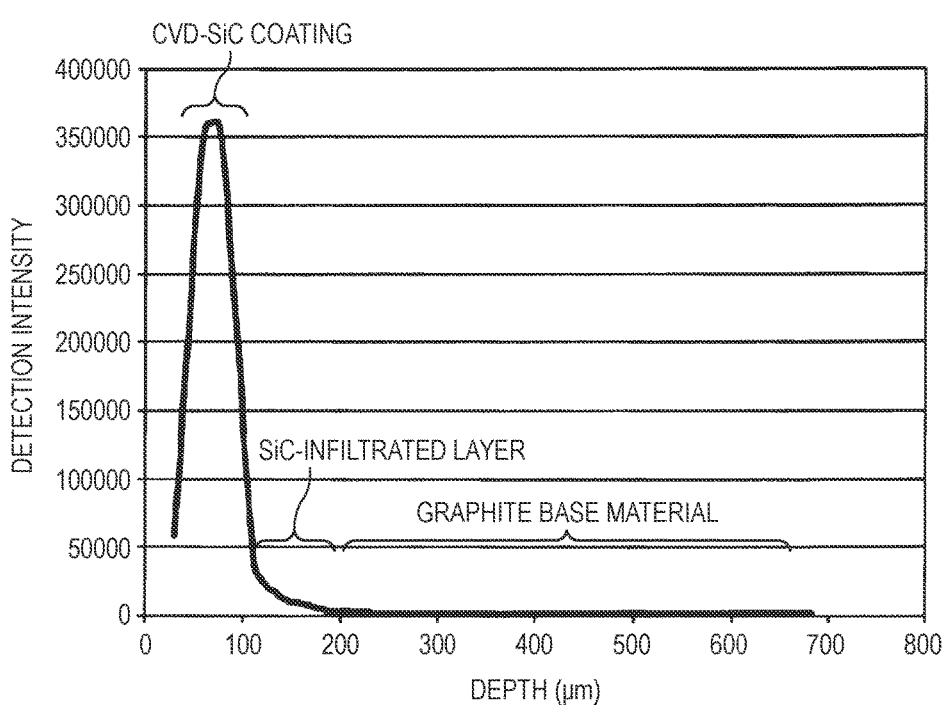
FIG. 6 is a graph obtained by analyzing a detection intensity of Si in a depth direction of the sample of FIG. 5 by means of EDX (energy dispersive X-ray spectrometry).

Furthermore, by measuring the detection intensity of Si by means of EDX (energy dispersive X-ray spectrometry), the relative amount was confirmed (see FIGS. 2, 4, and 6). In the graph, the ordinate is a detection intensity of Si, and the abscissa is a scale in the depth direction.

The exfoliation strength was measured by bonding a pin of φ3 mm to the CVD-SiC coating of the SiC-coated carbon composite material and drawing it.

In addition, the deformation of the SiC-coated carbon composite material was judged in the following manner. That is, using a non-contact type coordinate measuring instrument (model name: SmartScope ZIP 300, manufactured by QVI: Quality Vision International, Inc.), the deformation of the sample of 15×15 mm was confirmed in terms of a flatness, thereby judging whether or not detrimental deformation for use as the SiC-coated carbon composite material was present. ○ denotes "usable"; Δ denotes "influenced"; and x denotes "non-usable".

In Example 1, the CVD process was carried out by being divided to two stages. The CVD process was performed such that the concentration of a raw material gas (MTS) was 1.6% in the first stage and 6.4% in the second stage, respectively. A reaction temperature was 1,200° C.

The concentration of the raw material gas in the second stage is higher than that in the first stage, and the decomposition rate of the raw material gas becomes faster. For this reason, at the first stage, the SiC-infiltrated layer is formed to a region (second region) on the far side from the surface. Subsequently, at the second stage, the SiC-infiltrated layer is formed to a region (first region) on the near side from the surface. In this way, the SiC-infiltrated layer constituted of the plural regions where the Si content becomes smaller stepwise in the order from the surface can be formed. In other words, the SiC-infiltrated layer constituted of the first region and the second region having a smaller Si content than that of the first region in the order from the surface can be formed.

In addition, in the present Example, the SiC-infiltrated layer is formed in a thickness reaching 313 μm.

In Comparative Example 1, the CVD process was performed by one stage. The concentration of the raw material gas (MTS) is 6.4%, a value of which is identical with that at the second stage in Example 1. The reaction temperature was 1,300° C.

In Comparative Example 2, the CVD process was performed by one stage. The concentration of the raw material gas (MTS) is 6.4%, a value of which is identical with that at the second stage in Example 1. The reaction temperature was 1,350° C.

TABLE 1

|  | Stage number of CVD process | MTS concentration | Reaction temperature |
|---|---|---|---|
| Example | 2 | 1.6% ⇒ 6.4% | 1200° C. |
| Comparative Example 1 | 1 | 6.4% | 1300° C. |
| Comparative Example 2 | 1 | 6.4% | 1350° C. |
| Comparative Example 3 | 1 | 6.4% | 1200° C. |

TABLE 2

|  | Region number of SiC-infiltrated layer | Thickness of SiC-infiltrated layer | Exfoliation strength | Deformation Flatness | Judgement |
|---|---|---|---|---|---|
| Example | 2 | 313 μm | 55 MPa | 5.47 μm | ○ |
| Comparative Example 1 | 1 | 17 μm | 20 MPa | 5.79 μm | ○ |
| Comparative Example 2 | 1 | 71 μm | 35 MPa | 5.24 μm | ○ |
| Comparative Example 3 | Unmeasurable | Unmeasurable | Unmeasurable | Unmeasurable | x |

In comparison of the Example with the Comparative Examples, it was confirmed that in the Examples in which the SiC-infiltrated layer was formed in the two regions, the exfoliation strength is sufficiently larger than that in Comparative Examples 1 and 2, and the stronger exfoliation strength is obtained by forming the SiC-infiltrated layer by being divided to the plurality of regions where the Si content becomes smaller stepwise in the order from the surface.

In addition, as for the graphite base material used in the Example, the porosity was sufficiently low as 16%, and even when the CVD-SiC coating was formed to form the SiC-infiltrated layer composed of two regions having a different Si content from each other, the flatness was not affected, and the generation of detrimental deformation for use was not found. It may be assumed that an effect for controlling the amount of SiC in the second region on the far side from the surface such that it does not become excessively large in the first stage of the CVD process is brought.

Furthermore, as for the graphite base material used in the Example and Comparative Examples, since the true density is thoroughly high as 2.20 g/cm$^3$, even when the CVD-SiC coating was formed, the graphitization due to heating was not advanced, and deformation or the like was not found. Furthermore, since a graphite base material having a high true density was not used, the graphitization was not excessively advanced, and the influence in the c-axis direction with a weak strength was hardly given. Thus, it may be considered that the thorough exfoliation strength was obtained.

The invention is not restricted to the above-described embodiment, and suitable modifications, improvements, and the like can be made. Moreover, the materials, shapes, dimensions, numerical values, forms, numbers, installation places, and the like of the components are arbitrarily set as far as the invention can be attained, and not particularly restricted.

It is to be noted that the present application is based on a Japanese patent application filed on Jan. 29, 2015 (Japanese Patent Application No. 2015-015505), the entireties of which are incorporated by reference.

The invention claimed is:

1. A SiC-coated carbon composite material comprising:
   a graphite base material; and
   a CVD-SiC coating covering the graphite base material,
   wherein a porosity of a core part of the graphite base material is 12 to 20%,
   wherein a SiC-infiltrated layer extending from the CVD-SiC coating is included in a periphery of the core part,
   wherein the SiC-infiltrated layer is constituted of a plurality of regions arranged such that Si content becomes smaller stepwise in an order from a first surface on the CVD-SiC coating side toward a second surface on the graphite base material side,
   wherein all of the SiC included in the SiC-coated carbon composite material is formed by CVD method,
   wherein the SiC-infiltrated layer includes SiC which is deposited inside pores of the graphite base material,
   wherein the SiC-infiltrated layer has the thickness of 300 μm or more, and
   wherein the porosity of the core part is 15 to 17%.

2. The SiC-coated carbon composite material according to claim 1,
   wherein the SiC-infiltrated layer is constituted of a first region to an i-th region to an n-th region arranged in this order from the first surface toward the second surface, and Si content of the i-th region is larger than Si content of an (i+1)-th region.

3. The SiC-coated carbon composite material according to claim 1,
   wherein a true density of the core part is 2.15 to 2.23 g/cm$^3$.

4. A SiC-coated carbon composite material comprising:
   a graphite base material in which a porosity of a core part thereof is 12 to 20%; and
   a CVD-SiC coating covering the graphite base material,
   wherein a SiC-infiltrated layer extending from the CVD-SiC coating is included in a periphery of the core part, wherein the SiC-infiltrated layer is constituted of a first region arranged on the CVD-SiC coating side and a second region arranged on the graphite base material side and having a smaller Si content than that of the first region, wherein all of the SiC included in the SiC-coated carbon composite material is formed by CVD method, wherein the SiC-infiltrated layer includes SiC which is deposited inside pores of the graphite base material, wherein the SiC-infiltrated layer has the thickness of 300 μm or more, and wherein the porosity of the core part is 15 to 17%.

5. The SiC-coated carbon composite material according to claim 4, wherein a true density of the core part is 2.15 to 2.23 g/cm$^3$.

* * * * *